United States Patent [19]

Chen et al.

[11] Patent Number: 5,077,272
[45] Date of Patent: Dec. 31, 1991

[54] PREPARATION METHOD OF BULK Y—BA—CU—O SUPERCONDUCTORS WITH HIGH TRANSPORT CRITICAL CURRENT DENSITY

[75] Inventors: Kouth Chen, Taipei Hsien; W. H. Lee, Hsinchu, both of Taiwan

[73] Assignee: Industrial Technology Research Institute, Taiwan, Taiwan

[21] Appl. No.: 516,058

[22] Filed: Apr. 27, 1990

[51] Int. Cl.$^5$ .................. C01B 13/14; C01F 11/02; C01G 3/02; C04B 35/60
[52] U.S. Cl. .......................... 505/1; 252/521; 264/66; 419/25; 419/29; 419/53; 423/604; 423/635; 501/123; 505/742; 505/780
[58] Field of Search .............. 505/1, 742, 780; 423/604, 635; 264/66; 501/123; 419/25, 29, 53

[56] References Cited

U.S. PATENT DOCUMENTS 4,943,557 7/1990 Ling ........................... 505/1
4,956,336 9/1990 Salama et al. ................ 505/1

*Primary Examiner*—Paul Lieberman
*Assistant Examiner*—John Boyd
*Attorney, Agent, or Firm*—Scully, Scott, Murphy & Presser

[57] ABSTRACT

A preparation method of bulk $YBa_2Cu_3O_x$ superconductors with high transport critical current and critical current density (Jc), wherein x is $7-\delta$, obtained by a modified melt-textured growth method. A continuous dc current carrying capacity exceeding 120 A with critical current density, Jc, higher than 37300 A/cm$^2$ at 77K has been obtained for the prepared superconductor.

1 Claim, 12 Drawing Sheets

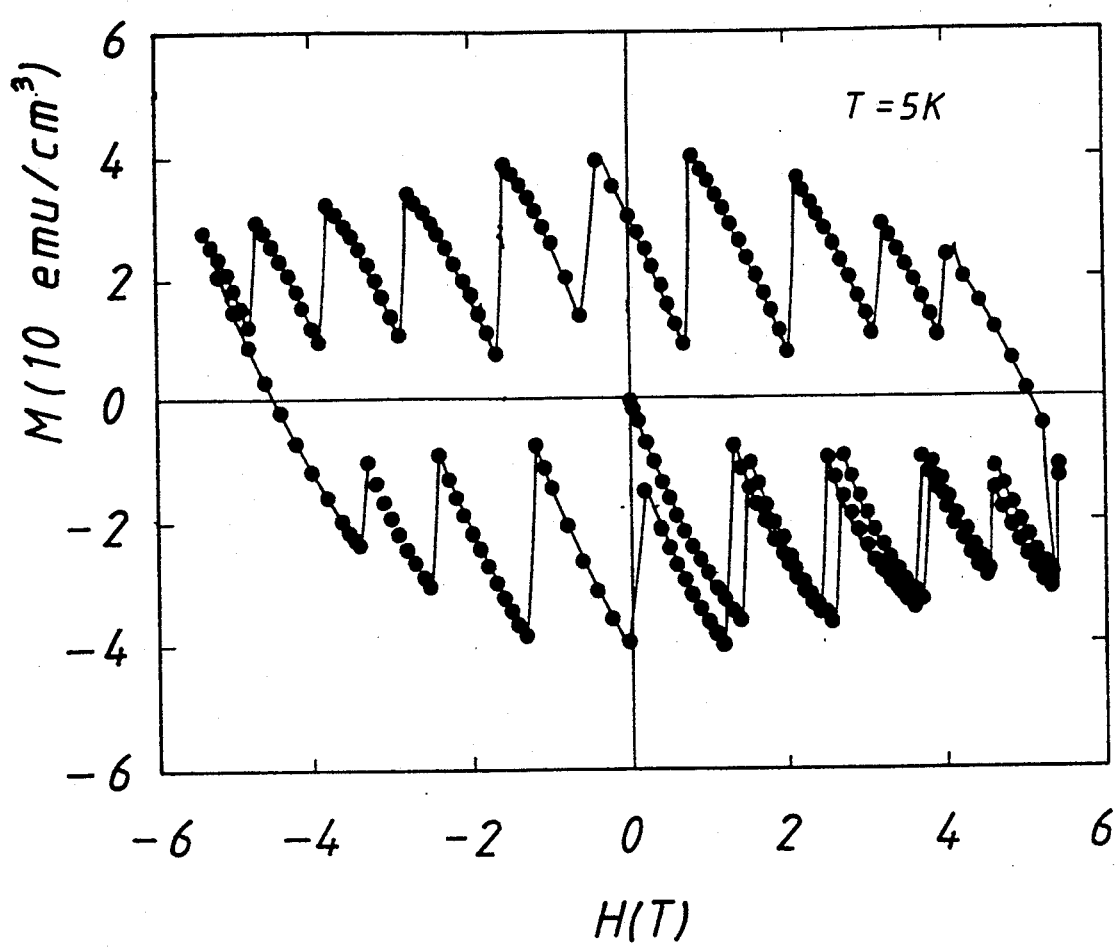
Fig. 9·a

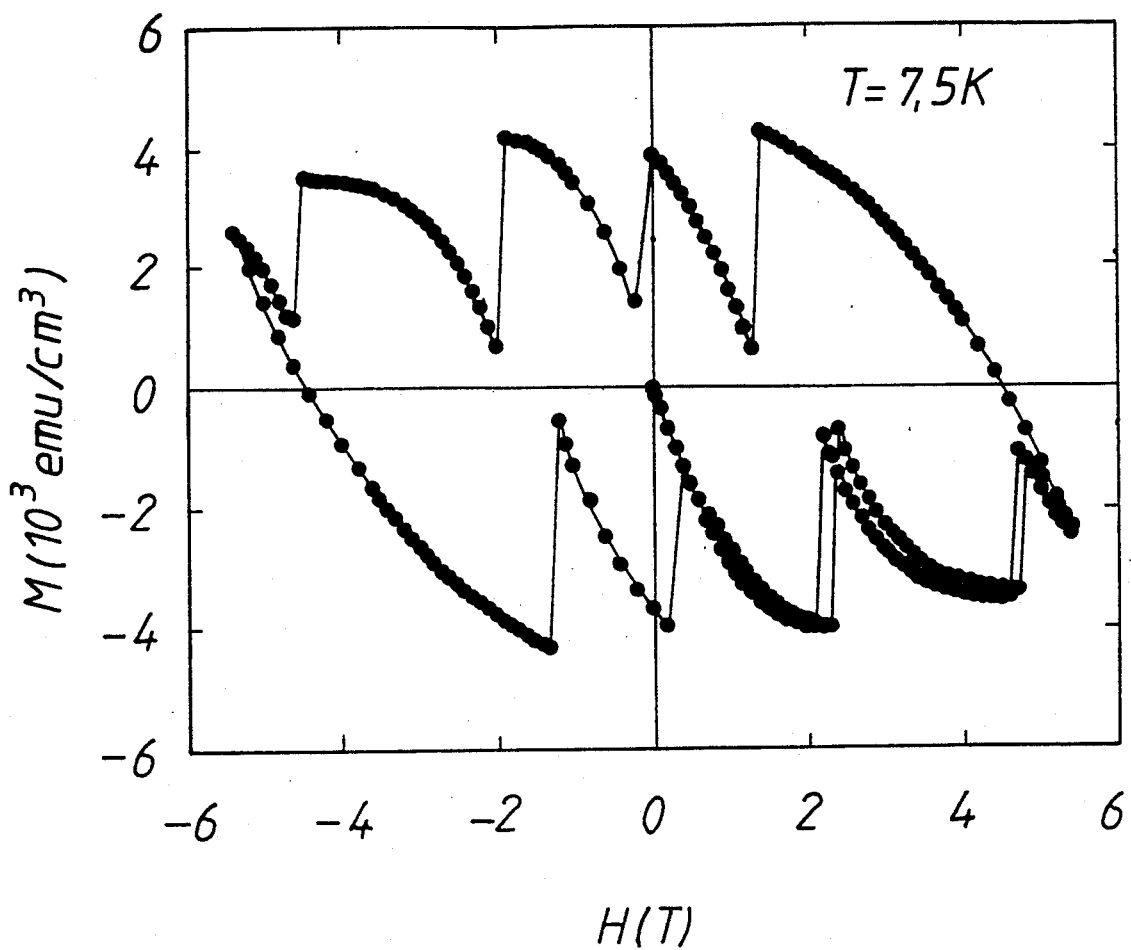
Fig. 9-b

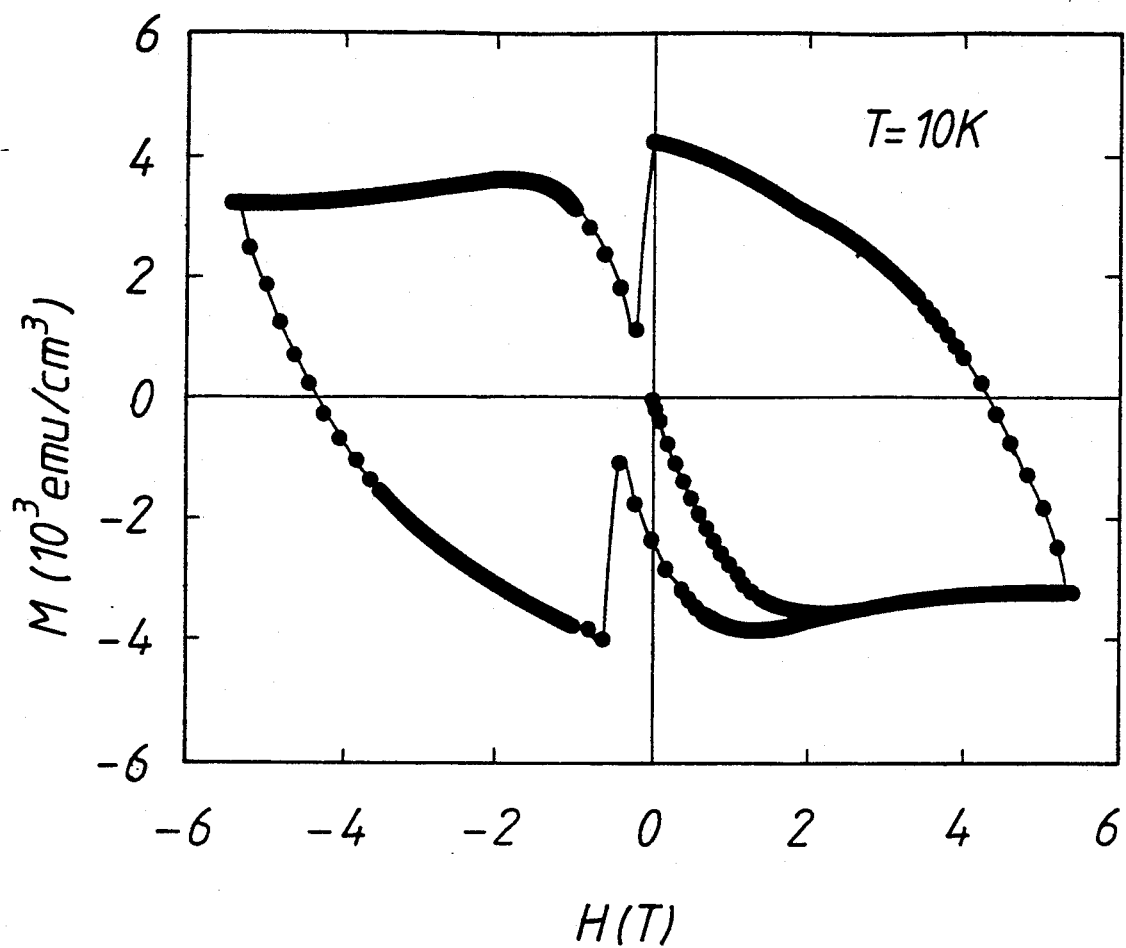
Fig. 9-C

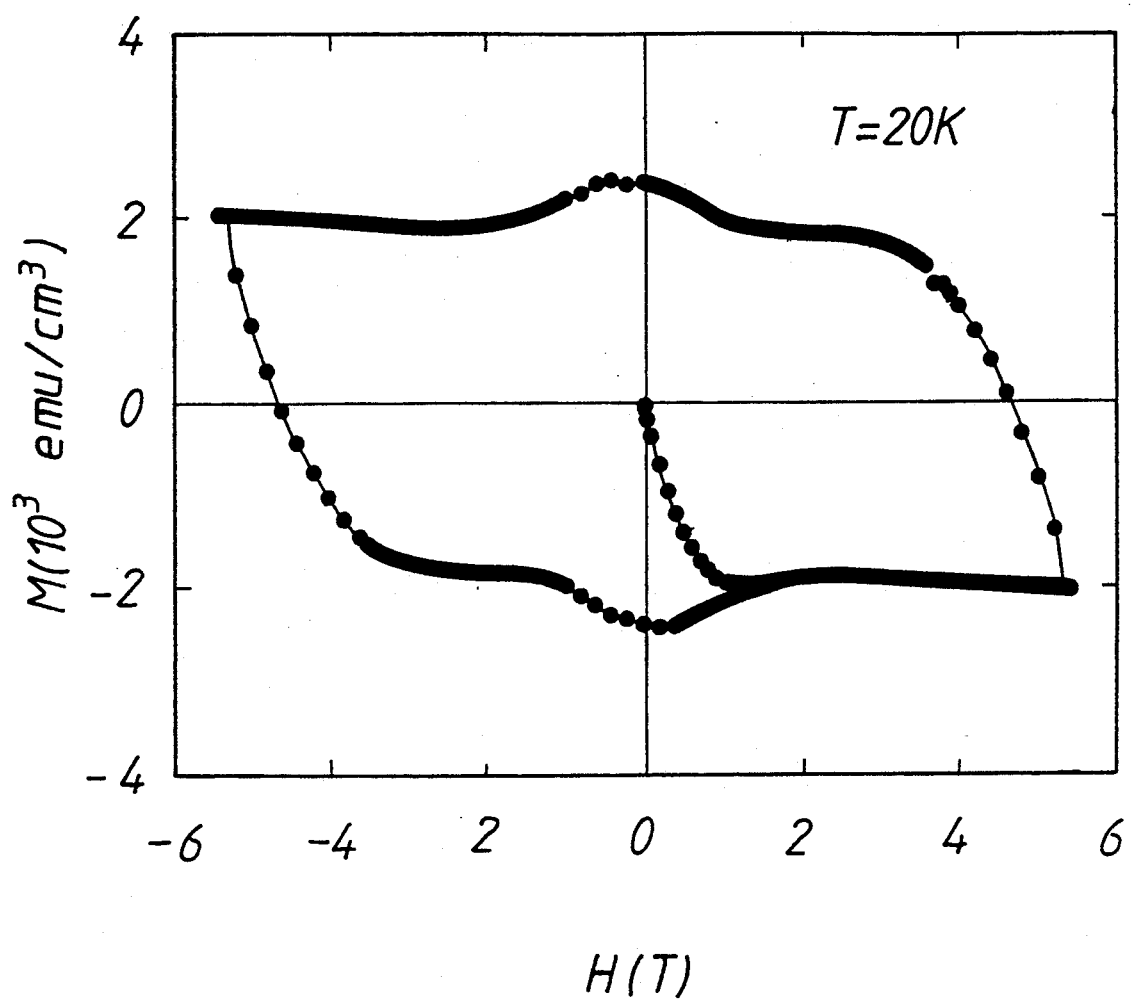
Fig. 9-d

PREPARATION METHOD OF BULK Y—BA—CU—O SUPERCONDUCTORS WITH HIGH TRANSPORT CRITICAL CURRENT DENSITY

BACKGROUND OF THE INVENTION

The present invention relates to a preparation method of a $YBa_2Cu_3O_x$ superconductor, wherein $x = 7 - \delta$, having high transport critical current (Ic) and critical current density (Jc), obtained by a modified melt-textured growth method. In accordance with the present invention, the $YBa_2Cu_3O_x$ superconductor formed possesses high transport Ic and Jc.

The discovery of high critical temperature superconducting oxides, including a number of materials which superconduct above liquid-nitrogen temperature, has stimulated considerable interest and activity. A limit to applications of these materials is the low critical current density Jc measured in bulk polycrystalline samples. Several fabrication techniques to increase transport Jc have been reported in the conventional literature. Magnetic field alignment, melt-textured growth, and liquid phase methods can significantly enhance Jc values. Currently, further fabrication techniques for the preparation of $YBa_2Cu_3O_x$ superconductors and the products thereof have been proposed. However, if these superconductors are to be practically useful, the transport critical current density should be greater than 10,000 $A/cm^2$ at liquid nitrogen temperature (77K). These $YBa_2Cu_3O_x$ superconductors obtained from general methods possess a transport critical current density from 150 to 600 $A/cm^2$ at 77 K. However, these values are far below the applicable range. The transport critical current density of a single crystal may be greater than $10^4$ $A/cm^2$, but the size of the product is small, which cannot be used in practice. The transport critical current density of epitaxially grown thin films may be greater than $10^6$ $A/cm^2$, but the film is thin, and the critical current (Ic) can only reach a maximum of about 3 to 5 amp (A). Besides, the thin film must be deposited onto an expensive single crystal substrate. Thus, the application of the product obtained in accordance with the prior process is not so convenient.

SUMMARY OF THE INVENTION

Therefore, it is an object of the present invention to provide a method of bulk $YBa_2Cu_3O_x$ superconductor preparation of which the superconductor can carry higher than 120 A continuous dc current, corresponding to a critical current density Jc above 37300 $A/cm^2$, at 77K. It is another object of the present invention to provide a method of bulk $YBa_2Cu_3O_x$ superconductor preparation of which the superconductor presents a flux jump in the sample a-b plane and c-axis at low temperature.

These and other objects, advantages and features of the present invention will be more fully understood and appreciated by reference to the written specification.

BRIEF DESCRIPTION OF THE DRAWINGS

FIG. 9 shows the magnetization hysteresis of a high transport critical current density $YBa_2Cu_3O_x$ sample at (a) 5K, (b) 7.5 K, (c) 10 K, and (d) 20 K.

DETAILED DESCRIPTION OF THE INVENTION

Figure 1:
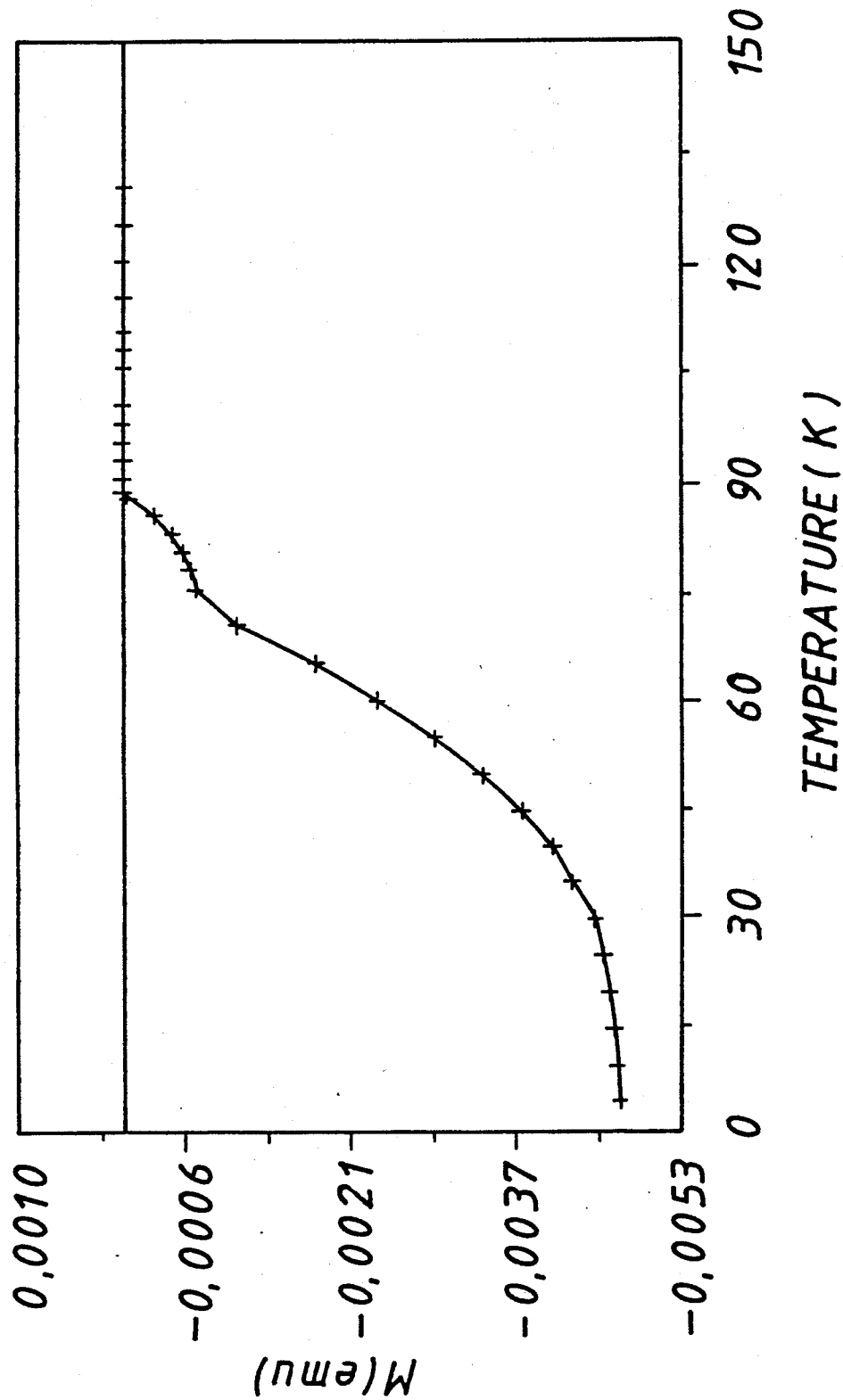
FIG. 1 shows the zero-field-cooled magnetization curve of the superconductor without the steps of 980° C. (48 h) and slow cooling from 980° C. to 900° C. (5° C./h)

The present invention relates to a $YBa_2Cu_3O_x$ superconductor, wherein $x = 7 - \delta$, having high transport current density, obtained by a modified melt-textured growth method.

In accordance with the present invention, $Y_2O_3$, $BaO_2$, and CuO powders are uniformly mixed in a ratio of Y:Ba:Cu = 1:2:3 and pressed into a thick pellet of 2.54 cm in diameter and 0.5 to 0.8 cm thick. The thick pellet is sintered at 940° C. for 24 h, reground and pressed and then annealed at 980° C. for 48 h. The temperature of the sample is lowered from 980° C. to 550° C. in 8h and is maintained at this temperature from about 10 to 20 h. After that, the temperature is lowered to 400° C. in 8 h, maintained at 400° C. for 10 to 20 h, and finally lowered to room temperature in 6 h. At this stage, the volume of the sample is reduced by about 30% of the original volume. The sample is then introduced vertically into a furnace which is preheated to 1100° C. and then annealed according to the following temperatures and time durations: 1100° C. for 10 min; 1100° C. to 1030° C. in 20 min; 1030° C. to 980° C. in 50 h; 980° C. for 8h; 980° C. to 900° C. in 16 to 30 h; 900° C. to 550° C. in 6 h; 500° C. for 10 to 20 h; 550° C. to 400° C. in 8 h; 400° C. for 10 to 20 h and then to room temperature. The annealed sample in accordance with the present invention can be made into plate-shaped bulk of 8 to 10 mm in length, 5 to 6 mm in width and, 1 to 2 mm in thickness.

Silver paint contacts are then painted on the top surface of the sample to form 4 contact points. The 4 contact points mentioned above are sintered at the following sintering temperatures and time durations. The resistivity of these contacts at 77K is $1 \times 10^{-7}$ ohm $cm^2$.

| Sintering Temperature (°C.) | Time duration |
| --- | --- |
| 25 to 900 | 3 h |
| 900 | 2 h |
| 900 to 550 | 6 h |
| 550 | 24 h |
| 550 to 400 | 8 h |
| 400 | 24 h |

| Sintering Temperature (°C.) | Time duration |
|---|---|
| 400 to 25 | 6 h |

Four leads are attached to the four contact points. The resistivity of these contacts is as low as approximately $10^{-7}$ ohm cm. Then, measurements for critical current and critical current density are formed.

The following Example further illustrates the method of preparation of the present invention. The Example is not intended to be limiting to the scope of the invention in any respect and should not be so construed.

EXAMPLES

Bulk YBaCuOx materials and five test samples were made according to the process of this invention described above. a four terminal technique, using a dc power supply of 120A rating (H.P. 6031A) and a Keithley 181 nanometer, was employed to determine the transport Jc in the 1 μV/cm criterion.

TABLE 1

| Sample | Ic (A) | Area (mm$^2$) | Jc (A/cm$^2$) |
|---|---|---|---|
| 1 | 71 | 0.8763 | 8102 |
| 2 | 74 | 1.121 | 6601 |
| 3 | 76 | 1.0672 | 7121 |
| 4 | 71 | 0.5 | 14200 |
| 5 | >120 | 0.3218 | >37300 |

Table 1 lists the critical current (Ic), cross sectional area (Area), and critical current density (Jc) of the five tested samples. Samples 1 to 4 were glued onto a plastic plate by a double-sided sticker. It was observed that all the four samples burnt out. Samples 1, and 3 fractured into two parts, and sample 2 and 4 melted. The burning out between the voltage and current contacts happened when continuous dc current reached 70 to 80 A. Sample 5 was attached to a silver plate (9.5×7.5×0.25 mm) by silver paint. This sample was able to sustain up to 120 A continuous dc current for 10 min without causing voltage drop across the sample within 1 μV/cm criterion at 77K. The corresponding critical current density Jc was higher than 37300 A/cm$^2$.

The burning out and fracture of the samples may be due to the effect of contact heating. At high current, I>70 A, the contact heating would raise the temperatures of the samples and sample substrates. In the plastic based samples, contact heating cannot be diffused into liquid nitrogen easily and continuously heated up the sample until the flux moved. The sample was then burnt out abruptly. Silver has much better thermal conductivity than plastic. Therefore, the sample attached to the silver plate could carry current up to 120 A without damaging the superconductivity. Flux jumps were observed in the magnetization hysteresis measurements for the above samples. These magnetization jumps are similar to those found in a $YBa_2Cu_3O_x$ single crystal prepared by conventional method. A plate type bulk $YBa_2Cu_3O_x$ sample of dimension 4×3.2×0.5 mm with the mass of 40 mg was used in the experiment. The data was measured by a quantum designed SQUID magnetometer in the applied field (H) between −5.4 and 5.4 Tesla(T). The hysteresis loop was taken in 70 min., with one data measurement per 18 sec.. In accordance with the present invention, FIG. 9 shows the magnetization hysteresis of a high transport critical current density $YBa_2Cu_3O_x$ sample a-b plane (H perpendicular to a-b plane) at (a) 5K, (b) 7.5 K, (c) 10 K, and (d) 20 K. At 5 K, flux jumps were observed all along the hysteresis loop (FIG. 9a). The spacing of the jumps becomes smaller when the applied field becomes bigger. At 7.5 K, the jumps are more spaced than at 5 K (FIG. 9b). There is only one jump appeared at 10 K (FIG. 9c), and no flux jump was observed at 20 K (FIG. 9d). The amplitude of magnetization seems not to change from 5 to 10 K, but significantly decreases by a factor of two at 20 K. By comparing the magnetization amplitude of the sample a-b plane at 5 and 77 K, it was estimated that the critical current density Jc is around $3 \times 10^6$ A/cm$^2$ at 5 K. Flux jumps also depend on the field sweeping rate. The number of jumps was reduced from 9 to 7 at 5 K when the measuring time was doubled. The jumps were hardly observed for the applied field perpendicular to the sample c-axis. At 5 K, one jump occurred at ×1 T when the field sweeping back from 5.4 to −5.4 T, and no jump was observed by sweeping the field from −5.4 to 5.4 T.

Flux jumps can be attributed to an avalanche process in the vortex line movement. At low temperatures, the magnetic diffusivity is higher than the thermal diffusivity in the superconducting materials. In other words, as the applied field was increased to some certain value or the Lorentz force was greater than the pinning force, flux lines suddenly moved and caused flux jumps. The jumps stop when the associated energy flow can be absorbed by the sample itself or its surroundings.

The application of high Tc superconductors is strongly dependent on their critical current density Jc. To increase Jc, the spinning force in the sample must be increased. But due to the low thermal conductivity of these materials, pinning force is not the only factor which affects the current density. The magnetic and thermal properties of the sample and its surroundings need to be considered as well.

Figure 4:
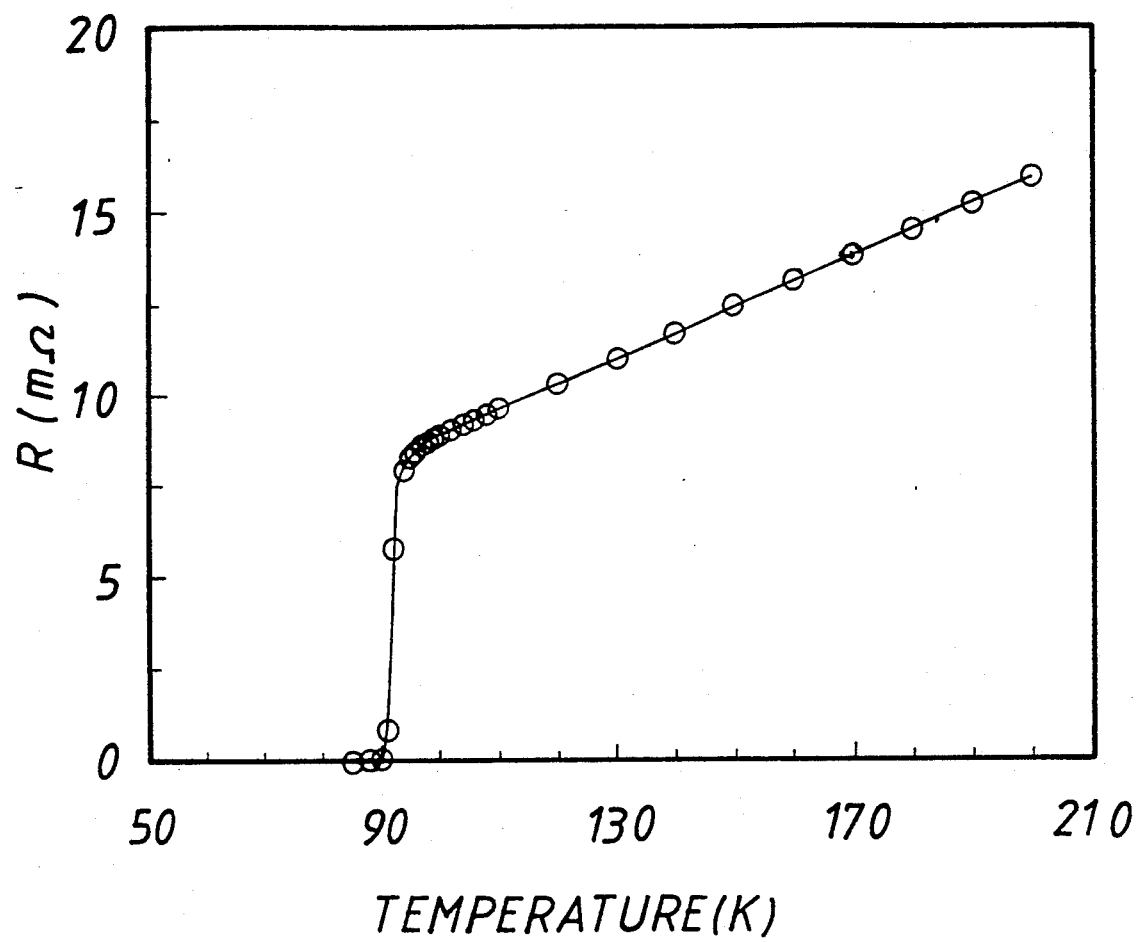
FIG. 4 shows the relationship between the resistance and temperature of the superconductor obtained in accordance with the present method.
Figure 5:
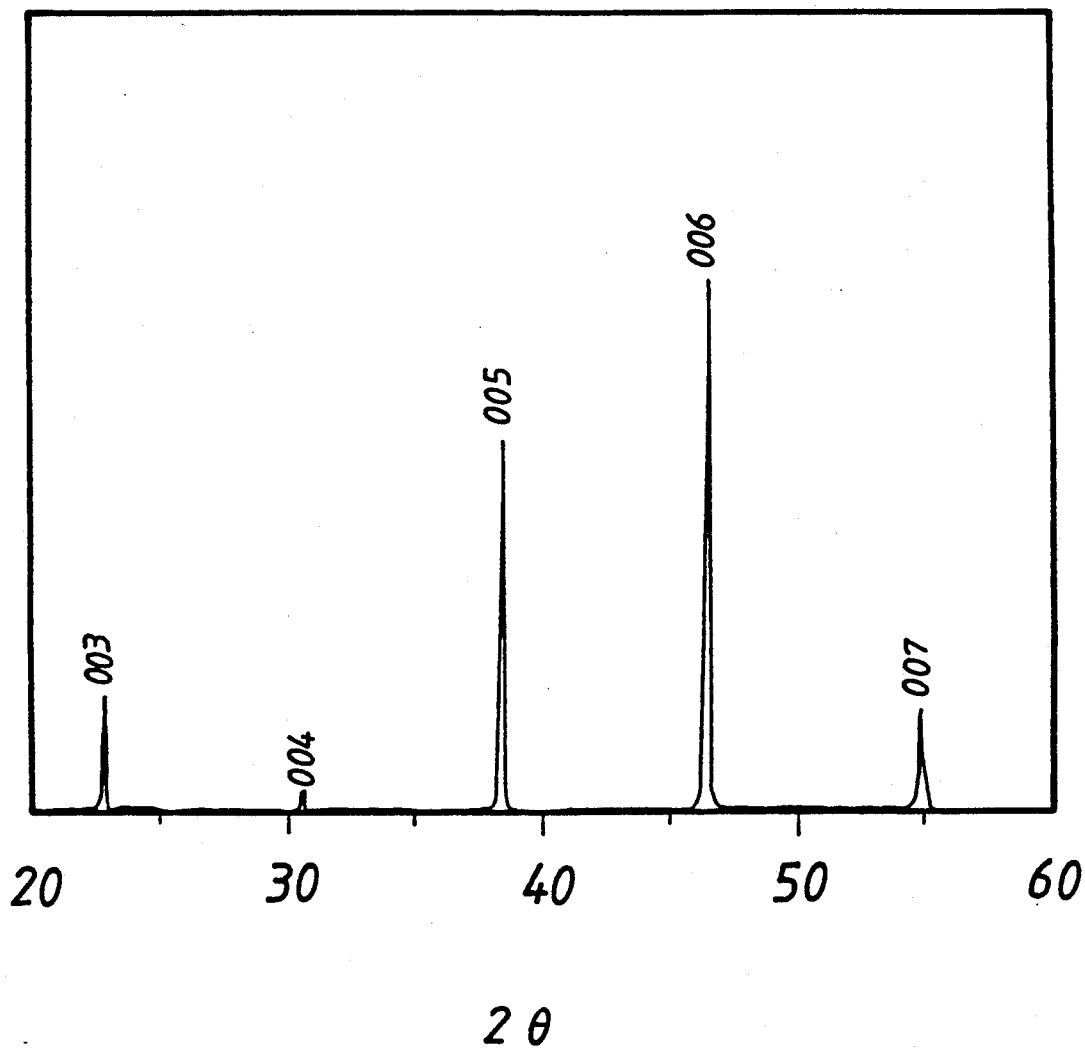
FIG. 5 shows the X-ray-diffraction pattern of the superconductor sample in accordance with the present invention.

The degree of sample orientation was determined from x-ray reflection spectra. The reflectivity is from the broad face of the sample, perpendicular to the c-axis in an oriented sample, so that in a perfectly oriented sample only (001)-reflections would contribute to X-ray reflection. FIG. 4 shows the relationship between the resistance and temperature of the superconductor obtained in accordance with the present method. FIG. 5 shows the X-ray reflection of a rectangle sample with dimensions of approximately 6×5×1 mm.

Figure 2:
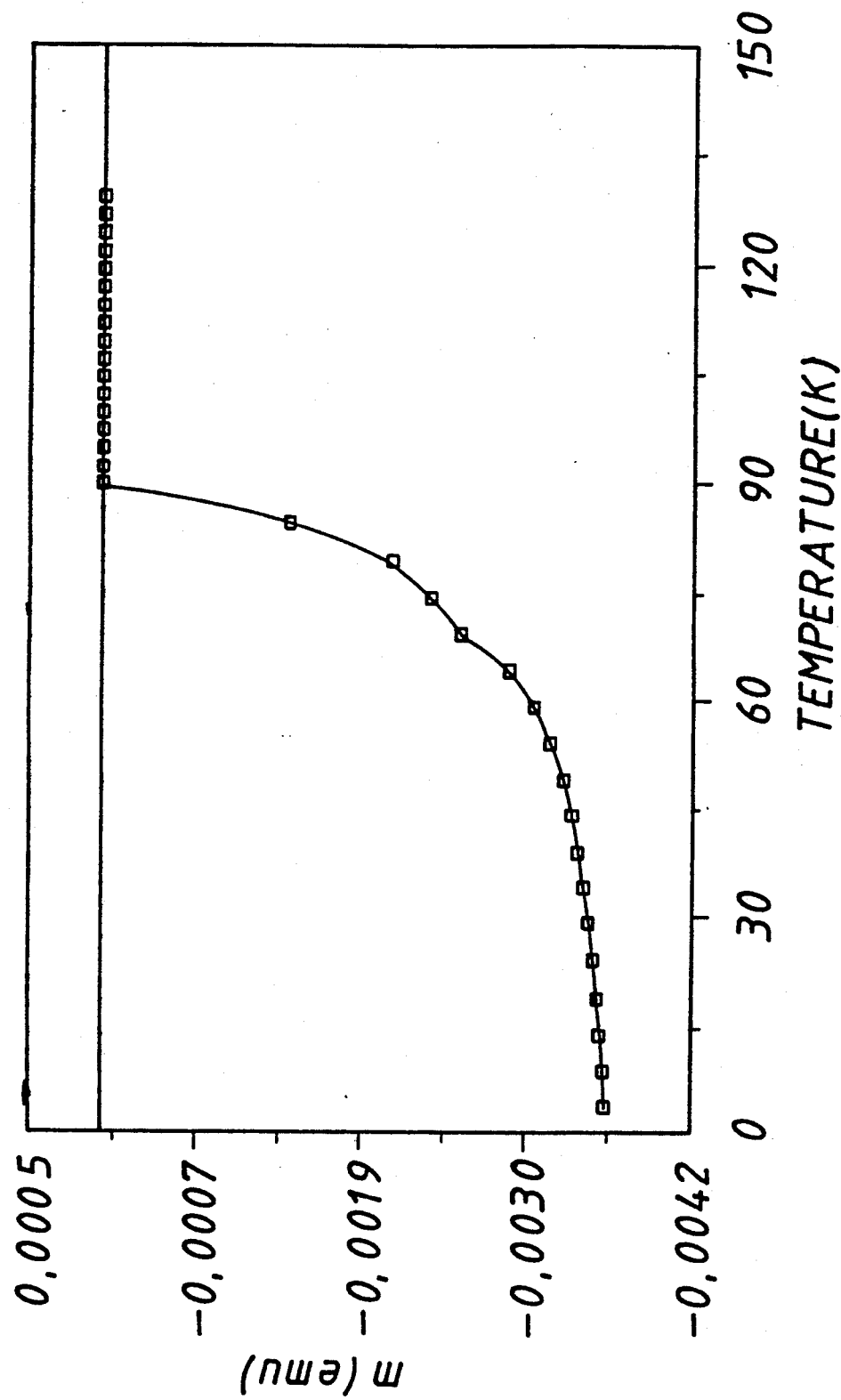
FIG. 2 shows the zero-field-cooled magnetization curve of the superconductor without the steps of annealing at 980° C. (48 h) but with furnace cooling from 980° C. to 900° C. in about 2 h.
Figure 3:
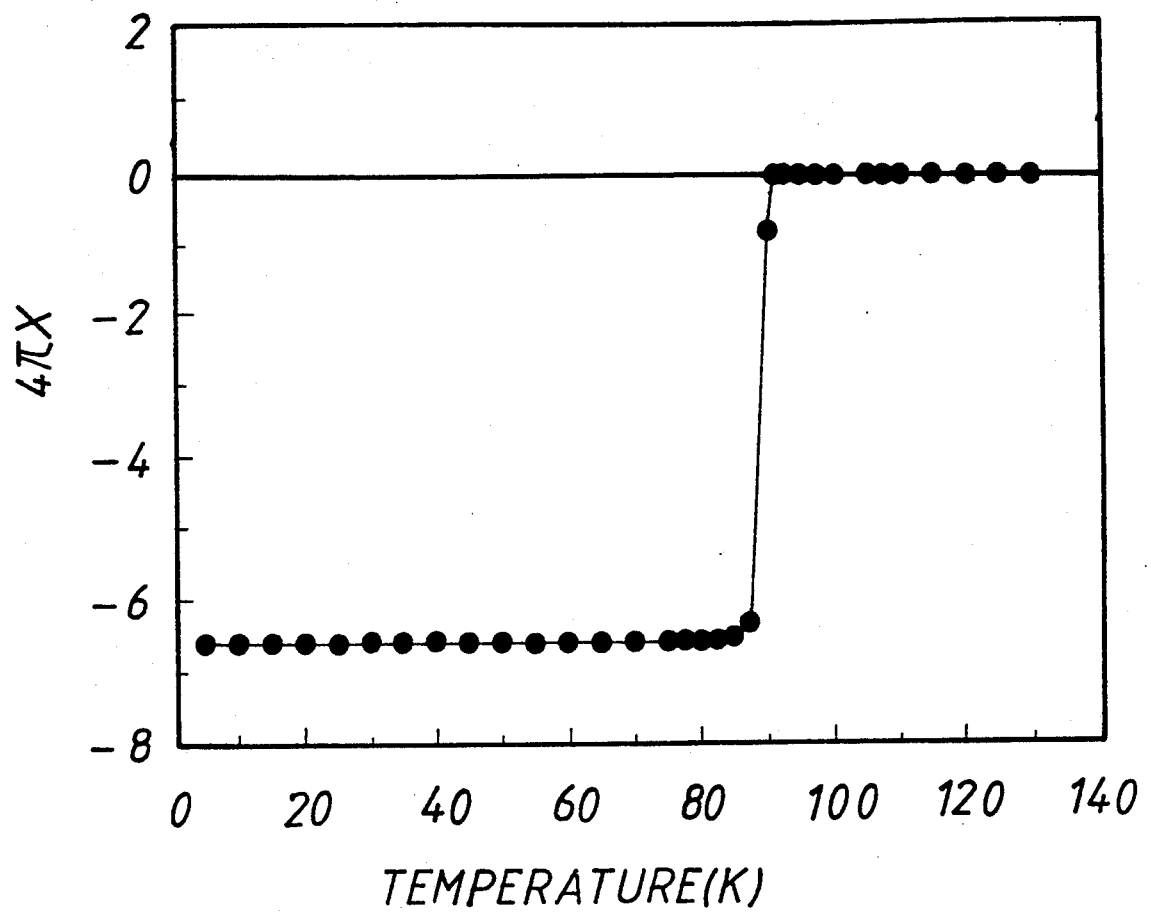
FIG. 3 shows the magnetization curve of the superconductor obtained in accordance with the present invention.

The magnetization and hysteresis data were measured by a quantum designed SQUID magnetometer. The three annealing procedures studied resulted in different magnetization data. FIG. 1 shows the zero-field-cooled (ZFC) magnetization data for a sample in accordance with the present invention without the steps 980° C. (48 h) and slow cooling from 980° C. to 900° C. (5° C./h). FIG. 2 shows the zero-field-cooled (ZFC) magnetization data for a sample in accordance with the present invention without the steps 980° C. (48 h). FIG. 3 shows the zero-field-cooled (ZFC) magnetization data for a sample in accordance with all the processing steps of the present invention. It is shown that FIG. 3 has the best superconducting transition.

The anisotropic properties of magnetization for an applied field parallel and perpendicular to the sample a-b plane were studied. Eliminating the geometric factor, the magnetization of a-b plane is isotropic for ZFC, and the FC had an anisotropic property, whose ratio was 4:3.

Figure 6:
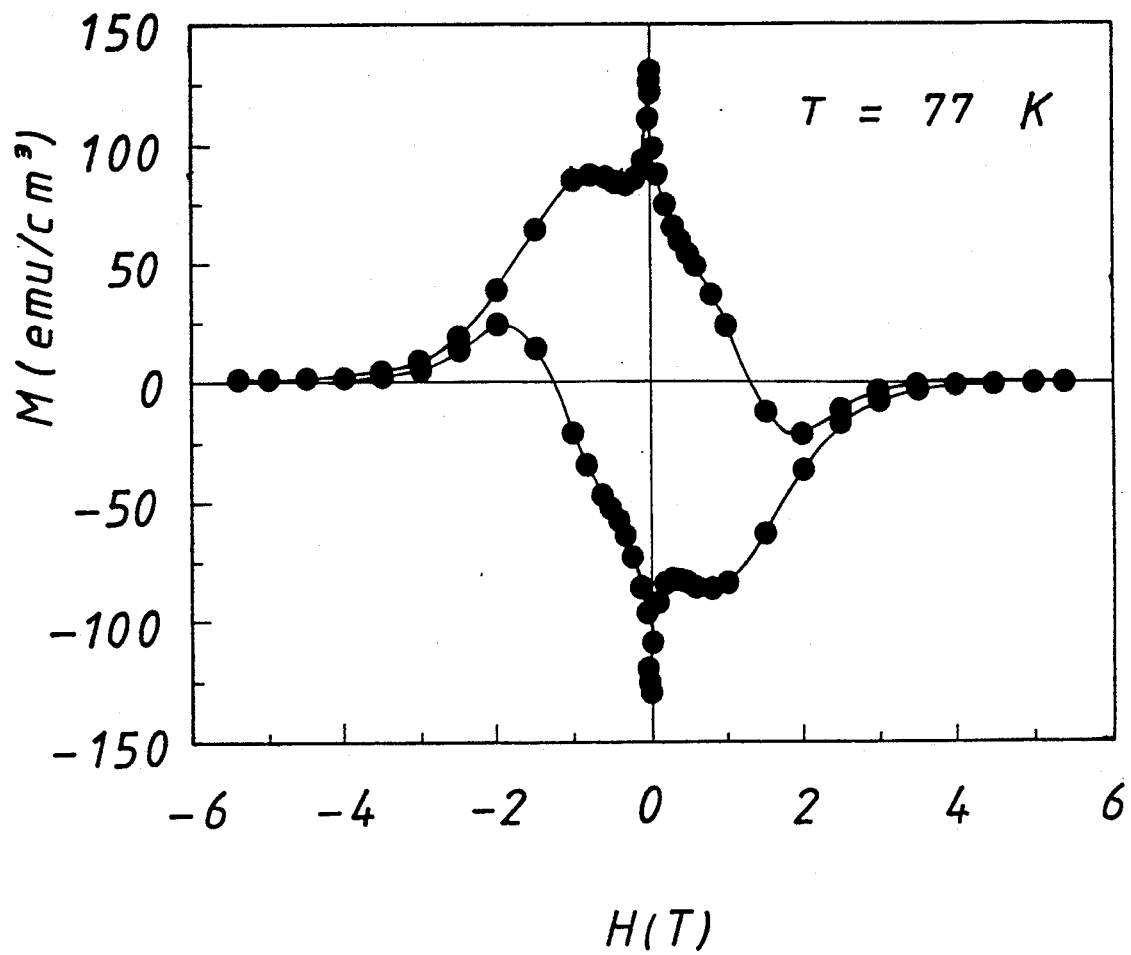
FIG. 6 shows the magnetization hysteresis loop of the superconductor at 77K.
Figure 7:
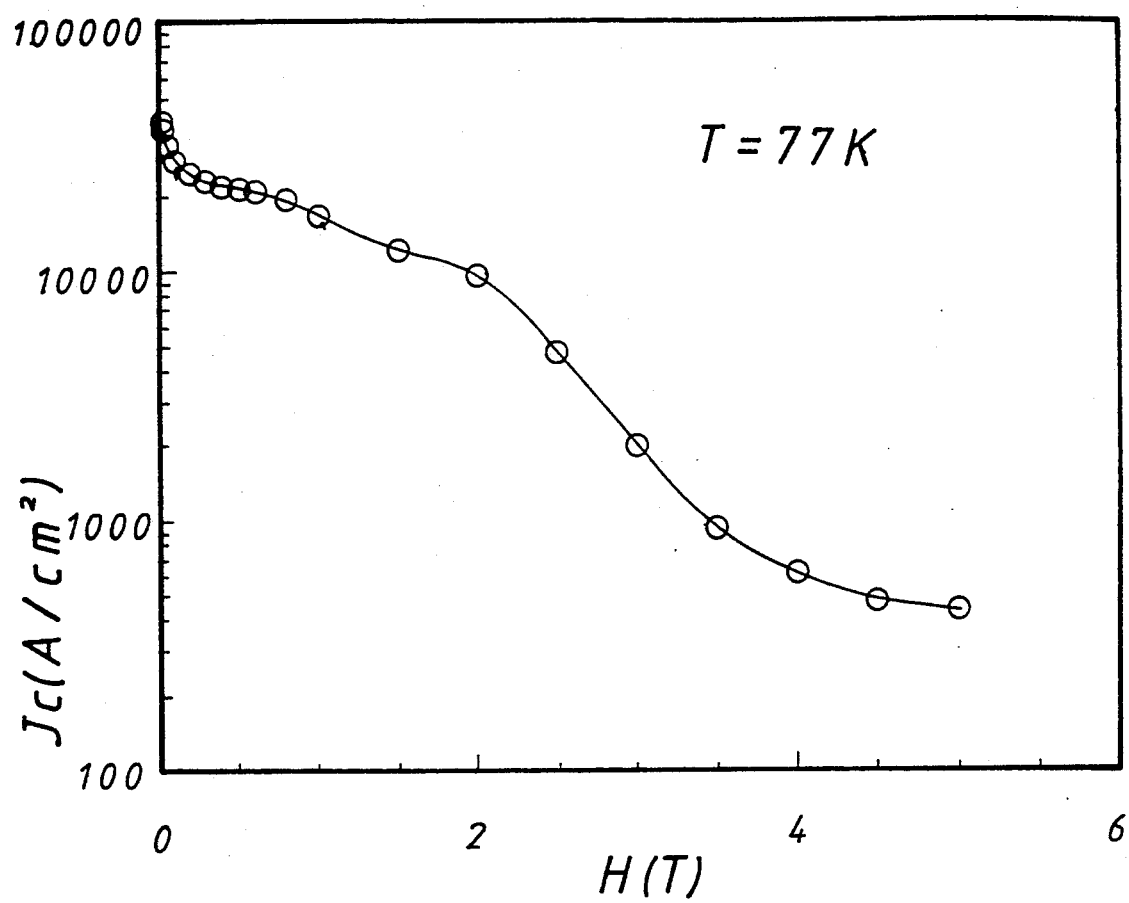
FIG. 7 shows the critical current density Jc, at 77K, calculated by Bean Model. The average grain size of the superconductor is approximately 1.5 mm.
Figure 8:
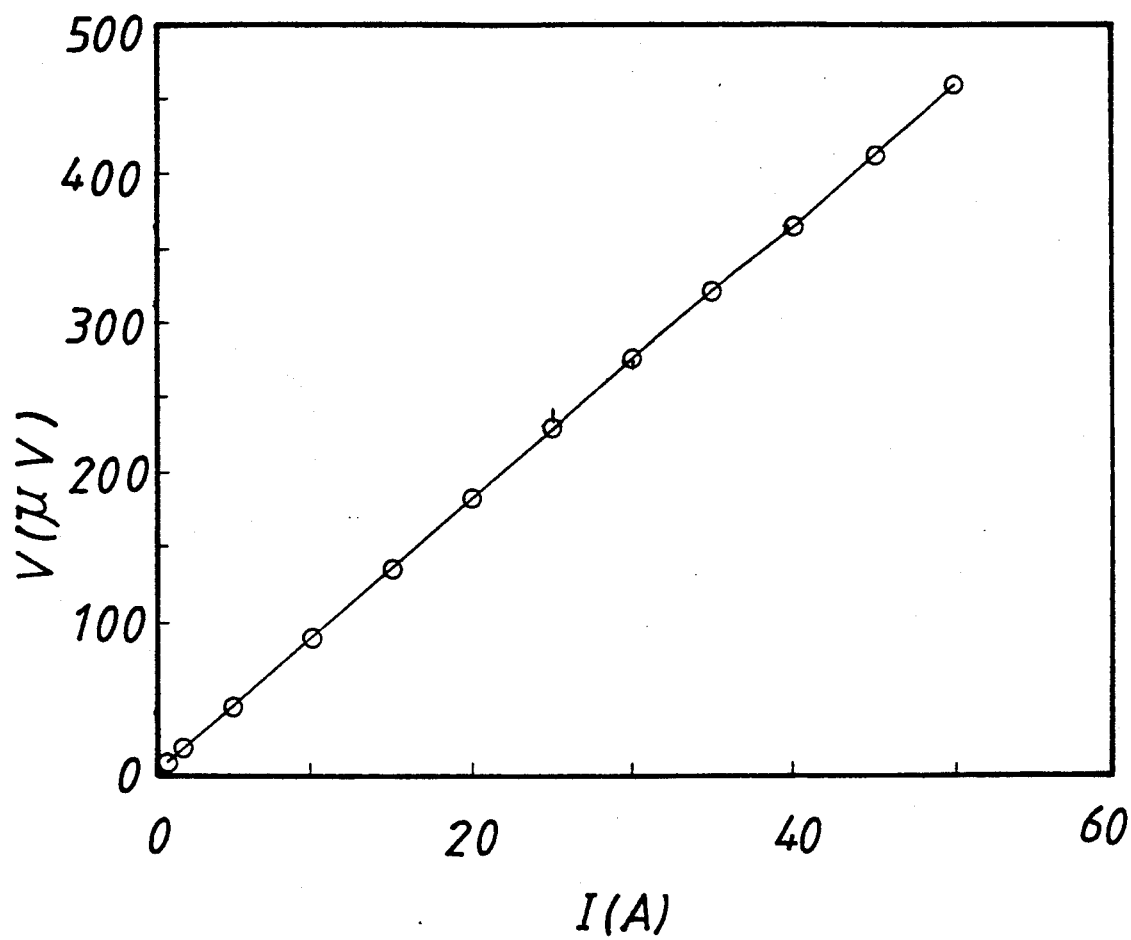
FIG. 8 shows the relationship between the voltage and the current of the silver plate used as a sample substrate.

FIG. 6 shows the magnetization hysteresis between −5.4 T and 5.4 T. From the Bean model, field dependent Jc was estimated up to 5 T at 77 K (as shown in FIG. 7). At zero field, Jc was found to be about 40,000 A/cm$^2$. FIG. 8 shows the relationship between the voltage and the current for the silver plate used as a sample substrate. In accordance with the present invention, a preferentially-oriented bulk $YBa_2Cu_3O_x$ superconductor was prepared. A continuous dc current carrying capacity exceeding 120 A with critical current density, Jc, higher than 37,300 A/cm$^2$ at 77K has been obtained.

The invention has been described in detail including the preferred embodiment thereof. However, it will be appreciated that those skilled in the art, upon consideration of this disclosure, may make modifications and improvements within the spirit and scope of this invention.

I claim:

1. A preparation method of bulk $YBa_2Cu_3O_x$ superconductors with high transport critical current and critical current density, wherein x is 7−δ, comprising the steps of:

(1) mixing $Y_2O_3$, $BaO_2$ and CuO in a ratio of Y:Ba:Cu=1:2:3 and compressing the mixture into a pellet of diameter 2.54 cm and a thickness of 0.5 to 0.8 cm;

(11) annealing said pellet at a temperature of 940° C. for 24 h and then lowering to room temperature;

(111) grinding said pellet to fine powder and then compressing to form a new pellet;

(IV) annealing the pellet obtained from (lll) in a furnace at a temperature of 980° C. for 48 h to 72 h;

(V) lowering the temperature of said pellet to 550° C. and maintaining at this temperature for 10 h to 20 h, and then lowering the temperature to 400° C. in 8 h and maintaining at this temperature for 10 h to 20 h, and lowering to room temperature;

(VI) introducing said pellet into a furnace preheated to 1100° C. and maintaining at this temperature for 10 mins, lowering the temperature from 1100° C. to 1030° C. in 20 min, 1030° C. to 980 ° C. in 50 h; and (VII) maintaining the temperature of said pellet at 980° C. for 8 h, lowering the temperature from 980° to 900° C. in 16 to 30 h, lowering the temperature to 550° C. in 6 h, maintaining at 550° C. for 10 to 20 h, lowering the temperature from 550° C. to 400° C. in 8 h, maintaining the temperature at 400° C. for 10 to 20 h and lowering the temperature of said pellet to room temperature.

* * * * *